United States Patent
Beutelschiess et al.

(10) Patent No.: US 6,864,688 B2
(45) Date of Patent: Mar. 8, 2005

(54) APPARATUS AND METHOD OF MONITORING INSULATION OF A DC NETWORK THAT IS ELECTRICALLY INSULATED WITH RESPECT TO THE GROUND POTENTIAL OF A DEVICE

(75) Inventors: Klaus Beutelschiess, Dettingen (DE); Karl-Heinz Landenberger, Bissingen (DE)

(73) Assignee: Ballard Power Systems AG, Kirchheim-Nabern (DE)

( * ) Notice: Subject to any disclaimer, the term of this patent is extended or adjusted under 35 U.S.C. 154(b) by 8 days.

(21) Appl. No.: 10/375,927

(22) Filed: Feb. 26, 2003

(65) Prior Publication Data

US 2003/0214306 A1 Nov. 20, 2003

(30) Foreign Application Priority Data

Mar. 21, 2002 (DE) .......................... 102 12 493

(51) Int. Cl.[7] ............................................. G01R 31/06
(52) U.S. Cl. ........................................ 324/551; 324/541
(58) Field of Search ...................... 307/70.1; 324/503, 324/509, 536, 544, 551, 716, 541; 340/647; 702/59

(56) References Cited

U.S. PATENT DOCUMENTS 5,495,908 A * 3/1996 Obara et al. ................ 180/65.8
5,760,488 A * 6/1998 Sonntag ...................... 307/10.1
5,818,236 A * 10/1998 Sone et al. .................. 324/509

FOREIGN PATENT DOCUMENTS

| DE | 20 51 836 C2 | 10/1983 |
| DE | 43 39 945 C1 | 6/1995 |
| DE | 43 39 946 A1 | 6/1995 |
| DE | 195 03 749 C1 | 4/1996 |
| DE | 199 50 008 A1 | 4/2001 |
| IT | 0 751 396 A1 * | 1/1997 ........... G01R/31/00 |

OTHER PUBLICATIONS

U.S. Appl. No. 10/361,151, Kollenda et al., filed Feb. 6, 2003.

* cited by examiner

Primary Examiner—Anjan Deb
Assistant Examiner—Walter Benson
(74) Attorney, Agent, or Firm—Seed IP Law Group PLLC

(57) ABSTRACT

Insulation monitoring of an electrical network such as a DC network which is electrically insulated with respect to the ground of a device, includes at least two insulation monitoring devices that monitor different network sections, which can be isolated by one or more switches. Non-contacting switches are used to alternatingly connect and isolate respective measuring resistors of the monitoring devices to, and from, ground, as a result of which the insulation monitoring devices can not negatively affect each other's measurements.

26 Claims, 1 Drawing Sheet

ABRIDGED

Figure 1:
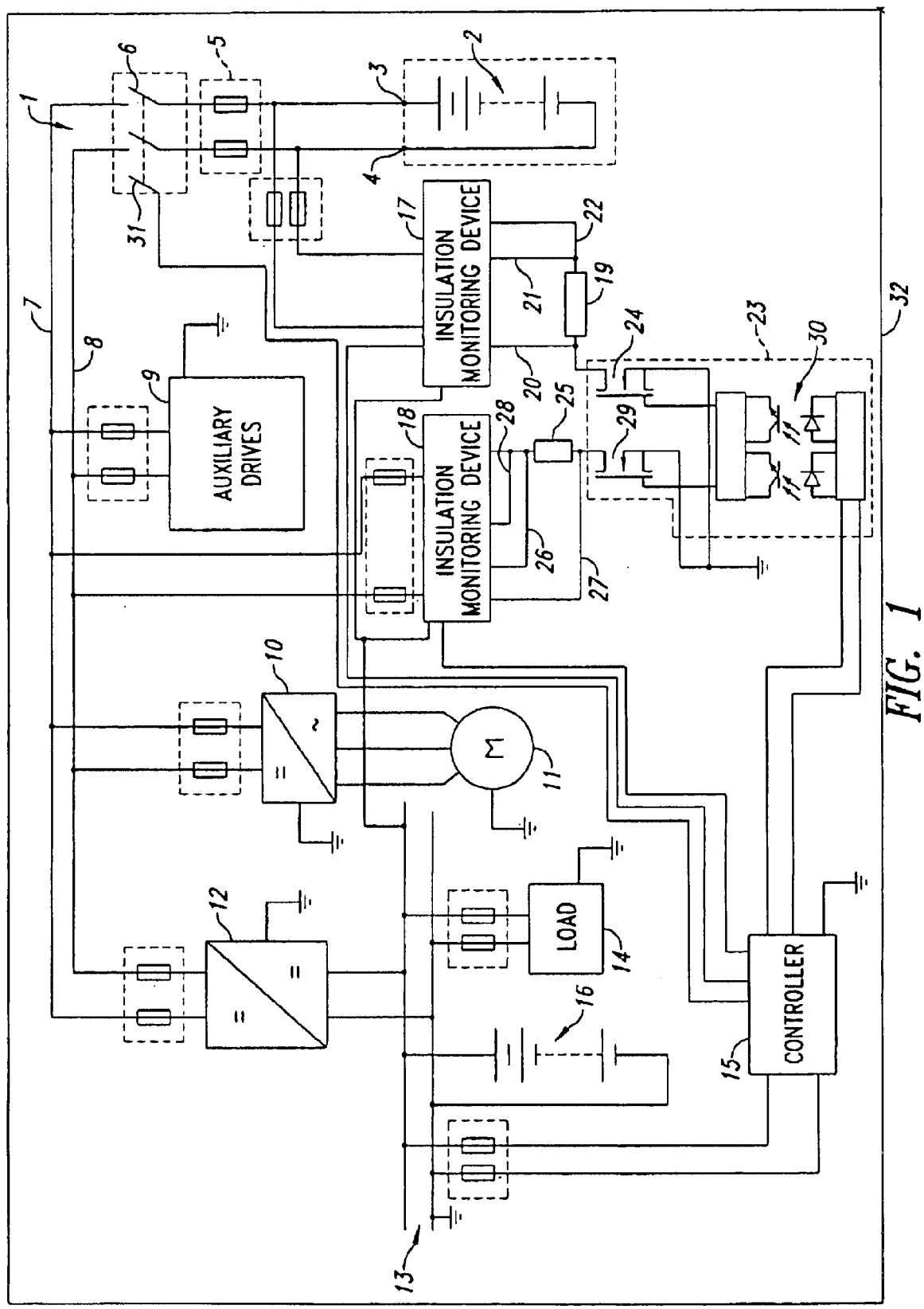

APPARATUS AND METHOD OF MONITORING INSULATION OF A DC NETWORK THAT IS ELECTRICALLY INSULATED WITH RESPECT TO THE GROUND POTENTIAL OF A DEVICE

BACKGROUND OF THE INVENTION

1. Field of the Invention

This invention is generally related to monitoring insulation of an electrically insulated DC network.

2. Description of the Related Art

DE 43 39 946 A1 is directed to a method and apparatus for insulation monitoring of an electrically insulated DC network that supplies DC loads and/or AC loads via an inverter, and which possesses an unavoidable ohmic and capacitive insulation resistance with respect to earth or ground. A series connection of one AC pulse voltage source and one measuring resistor is coupled to the DC network and to earth or ground. The AC pulse voltage source applies an AC pulse voltage with alternating positive and negative polarity to the measuring resistor. The measuring process is only enabled after a certain time delay following the application of the AC pulse voltage to the measuring resistor. Measurement values of voltage drops at the measuring resistor obtained in successive time intervals are, after subtraction from each other, further processed to determine the insulation resistance.

DE 20 51 836 C2 is generally directed to a device for insulation monitoring of ungrounded DC networks. The device has a primary winding that can be alternatingly connected between two network terminals and ground or earth, a secondary winding that is electrically isolated from the primary winding and which is connected to an evaluation circuit, and a compensating winding used to compensate for network voltage fluctuations.

DE 195 03 749 C1 is directed to a vehicle with a power supply network that is fed by a fuel cell or battery and is executed as an IT network. The loads that are connected to the load circuit also have a low-resistance electrical connection to the vehicle chassis. Looped in between the load circuit and the vehicle chassis is an insulation monitoring device that includes a balancing stage for a measuring bridge and a buffer amplifier stage that processes the measurement signals. A power supply network of this type is preferably arranged in an electrical vehicle. The term IT network in this context means that all components consuming electrical current are supplied by the two lines of the load circuit, which have a high-resistance connection to the vehicle chassis, and that—as a protective measure against too high a touch potential—connects all system components to be protected to each other and to the vehicle chassis with a low resistance, for example having a saturation resistance of <1 $\Omega$.

Many DC networks can be treated as having two or more portions. It would be advantageous to be able to monitor the insulation resistance with respect to a ground potential in each portion of a network. In particular, it would be advantageous to perform insulation monitoring independently of whether one or both network portions are connected or isolated with respect to one another, for example, by a switch.

BRIEF SUMMARY OF THE INVENTION

In one aspect, an apparatus for insulation monitoring of a DC network, the network being electrically insulated with respect to a frame potential of a device that contains the DC network; includes: a switch coupled in the network and selectively operable to electrically isolate a first portion of the network from a second portion of the network; a first insulation monitoring device electrically coupled to the first portion of the network on a first side of the switch to monitor an insulation resistance of the first portion of the network with respect to the frame potential; a second insulation monitoring device electrically coupled to the second portion of the network on a second side of the switch to monitor the second portion of the network with respect to the frame potential; and a non-contacting switch selectively operable in a first state to electrically couple the first insulation monitoring device to the frame potential and to electrically decouple the second insulation monitoring device from the frame potential, and selectively operable in a second state to electrically decoupled the first insulation monitoring device from the frame potential and to electrically couple the second insulation monitoring device to the frame potential. The non-contacting switches may be part of a semiconductor relay.

In another aspect, an electrical network for an electric vehicle, the network being electrically insulated with respect to a frame potential of the electric vehicle; includes: at least one power source; at least one load; a first switch coupled between the power source and the load, and selectively operable to electrically isolate a first portion of the network from a second portion of the network; a first insulation monitoring device electrically coupled to the first portion of the network on a first side of the switch to monitor an insulation resistance of the first portion of the network with respect to the frame potential; a second insulation monitoring device electrically coupled to the second portion of the network on a second side of the switch to monitor the second portion of the network with respect to the frame potential; a second switch selectively operable in a first state to electrically couple the first insulation monitoring device to the frame potential and to electrically decouple the second insulation monitoring device from the frame potential, and selectively operable in a second state to electrically decoupled the first insulation monitoring device from the frame potential and to electrically couple the second insulation monitoring device to the frame potential; and at least one controller coupled to control the second switch and to control the first and the second insulation monitoring devices, and the controller configured to evaluate measured values of the insulation resistances.

In a further aspect, a method of insulation monitoring of an electrical network, the network being electrically insulated with respect to a frame potential of a device that contains the network, at least one power source and at least one load; includes: during a first period, electrically coupling only a first one of a pair of measuring resistors to the frame potential, each of the pair of measuring resistors associated with a respective one of a first and a second measuring device; and determining an insulation resistance of the network; and during a second period, electrically coupling only a second one of the pair of measuring resistors to the frame potential; and determining an insulation resistance of the network.

In yet a further aspect, an apparatus for insulation monitoring of an electrical network, the network being electrically insulated with respect to a frame potential of a device that contains the network, includes: means for electrically coupling a first and a second measuring resistor to the frame potential, alternatingly; means for determining an insulation resistance of the network when only the first one of the measuring resistors is electrically coupled to the frame potential; and means for determining an insulation resistance of the network when only the second one of the measuring resistors is electrically coupled to the frame potential.

In the following, the invention will be described in more detail with the help of an exemplary embodiment that is shown in the figure and that will illustrate further details, features, and benefits.

BRIEF DESCRIPTION OF THE SEVERAL VIEWS OF THE DRAWING(S)

In the drawing, identical reference numbers identify similar elements or acts. The sizes and relative positions of elements in the drawing are not necessarily drawn to scale. For example, the shapes of various elements and angles are not drawn to scale, and some of these elements are arbitrarily enlarged and positioned to improve drawing legibility. Further, the particular shapes of the elements as drawn, are not intended to convey any information regarding the actual shape of the particular elements, and have been solely selected for ease of recognition in the drawing.

FIG. 1 is a schematic diagram of a DC power source, a load, a DC network electrically coupling the power source to the load, the DC network having components to perform insulation monitoring.

DETAILED DESCRIPTION OF THE INVENTION

In the following description, certain specific details are set forth in order to provide a thorough understanding of various embodiments of the invention. However, one skilled in the art will understand that the invention may be practiced without these details. In other instances, well-known structures associated with analog to digital (A/D) converters, filters, fuel cell stacks, controllers (e.g., microprocessors, microcontrollers), inverters, and electrical storage devices such as batteries and/or ultra-capacitors have not been shown or described in detail to avoid unnecessarily obscuring descriptions of the embodiments of the invention.

Unless the context requires otherwise, throughout the specification and claims which follow, the word "comprise" and variations thereof, such as, "comprises" and "comprising" are to be construed in an open, inclusive sense, that is as "including, but not limited to."

The headings provided herein are for convenience only and do not interpret the scope or meaning of the claimed invention.

FIG. 1 shows a high voltage DC power supply network 1, for example, of an electric vehicle 32. The electric vehicle 32 may take the form of a fuel cell powered vehicle or hybrid powered vehicle, and may further take the form of an automobile, bus, truck, utility vehicle (e.g., forklift, tow tractor, etc.), boat, train, or plane.

The high voltage power supply network 1 is a DC network. A first power source, for example, a fuel cell stack 2 which consists of a series of fuel cell modules, is provided. The fuel cell stack 2 generates a high voltage, for example, a nominal voltage in the approximate range 200–400 V. The fuel cell has two outputs 3, 4 corresponding to positive and negative potentials, that are connected via fuses 5 to a switch 6. The switch 6 may be an isolation switch, disconnect switch, or contactor. The switch 6 selectively couples the outputs 3, 4 of the fuel cell 2 to a positive line or conductor rail 7 and a negative line or conductor rail 8. Thus, the switch 6 in its open position creates at least two electrically isolated network portions of the high voltage network 1.

Components requiring electrical current are supplied by the fuel cell 2 via the lines 7, 8, which are electrically insulated with respect to a ground of the electric vehicle 32. The fuel cell 2 and its current and/or voltage carrying parts are electrically insulated with respect to ground as well. All the parts in the vehicle that have to be protected from too high a touch potential have a low-resistance connection to each other and to the vehicle body or chassis. The vehicle body is symbolically represented in FIG. 1 by the electrical schematic symbol for ground.

Auxiliary drives 9 are electrically coupled to the lines 7, 8, for example, via fuses. The auxiliary drives 9 are employed in the operation of the fuel cell 2. A DC/AC converter 10 is also electrically coupled to the lines 7, 8, for example, via fuses. A traction motor 11 is electrically coupled to the outputs of the DC/AC converter 10, which may for example be supplied with three-phase alternating current.

A DC/DC converter 12 is also electrically coupled to the lines 7, 8, for example, via fuses. The DC/DC converter 12 is electrically coupled to both the high voltage power supply network 1 and to a low voltage power supply network 13. The voltage of the low voltage power supply network 13 is lower than the voltage of the high voltage power supply network 1. For example, the voltage of the high voltage power supply network 1 may be approximately 400 V, while the voltage of the low voltage power supply network 13 may only be approximately 12V, 24V, or 48V. As used herein and in the claims, the terms high voltage and low voltage are used in a relative sense to one another, and are not necessarily indicative of the relative magnitude of the voltage with respect to other circuits, systems, power sources and/or vehicles.

Certain ones of the electrical loads are electrically coupled to the low voltage power supply network 13. For example, windshield wiper motors, heating resistors, fans, motors for power windows or sun roofs, light bulbs, etc 14. Further, a controller 15 may be electrically coupled to the low voltage power supply network 13, for example via fuses, and which represents a load that is supplied by the low voltage power supply network 13. A power source, such as a storage battery 16, may also be electrically coupled to the low voltage power supply network 13.

A first insulation monitoring device 17 is electrically coupled, for example via fuses, to the section of the high voltage power supply network 1 that extends between the outputs 3, 4 of the fuel cell 2 and the switch 6. A second insulation monitoring device 18 is electrically coupled, for example via fuses, to the section of the high voltage power supply network 1 that is connected to the output of the switch 6 (i.e., lines 7, 8).

The insulation monitoring devices 17, 18 for the DC networks may be of a design known in the art. For example, insulation monitoring devices that each contain a measuring resistor which is connected to ground and to which a voltage source applies positive and negative pulses during the measuring process such as those discussed in U.S. application Ser. No. 10/361,151, filed Feb. 6, 2003, and entitled "METHOD AND DEVICE FOR INSULATION MONITORING OF A DC NETWORK," may be suitable. In such insulation monitoring devices, the measuring resistor is connected to ground via an electrical switching element. The insulation test voltage is applied to the measuring resistor and the resulting voltage drop is picked off and evaluated.

Associated with the first insulation monitoring device 17 is a measuring resistor 19, one side of which can be connected to ground via a non-contacting switching element 24. Two lines 20, 21 connect the measuring resistor 19 to the first insulation monitoring device 17. In the first insulation measuring device 17, the lines 20, 21 are electrically coupled to a measuring system (not shown) such as an analog-digital converter. The first insulation monitoring device 17 applies the insulation test pulses to the measuring resistor 19 via a line 22. The non-contacting switching element 24 may be part of a semiconductor relay 23.

Associated with the second insulation monitoring device 18 is a measuring resistor 25, one side of which can be connected to ground via a non-contacting switching element 29. Two lines 26, 27 pick off the voltages that drop off at the measuring resistor 25 during a measuring pulse and route them to the second insulation monitoring device 18. In the second insulation monitoring device 18, the two lines 26, 27 are connected to a measuring system, e.g., to an analog-digital converter of a processor. The second insulation monitoring device 18 outputs the insulation test pulses to the measuring resistor 25 via a line 28. The non-contacting switching element 26 may be part of the semiconductor relay 23. The switching elements 24, 29 are alternatingly triggered by optocouplers 30 so that one is conducting in its saturated state while the other one is non-conducting. This control is implemented by the controller 15 that is controllingly coupled to the semiconductor relay 23. The controller 15 is also controllingly coupled to the insulation monitoring devices 17, 18.

The controller 15 alternatingly places the insulation monitoring devices 17, 18 in defined operating states to output insulation test pulses or to detect and evaluate the voltages picked off at the measuring resistors 19 and 25.

By activating the respective insulation monitoring device 17, 18, the controller 15 causes the associated respective switching device 24 or 29 to enter a conducting state, while the other switching device 29, 24 is in a non-conducting state. This means that in any time interval only one insulation monitoring device 17, 18 is active with regard to the connection to ground, so that the inactive monitoring device can not negatively affect the measurement, since the insulation monitoring devices 17, 18 are alternatingly connected to ground.

The relay 23 enables a rapid change of the connections of the insulation monitoring devices 17, 18 to their respective associated measuring resistors 19, 25. In particular, the semiconductor sections—controllable to be electrically conducting or non-conducting—of the switching means of the semiconductor relay 23 are arranged in the line between the connection point of a measuring resistor and the frame terminal. As a result of this configuration, the resistance that is still present when the semiconductor section is saturated and conducting will have no effect on the measurement due to its small magnitude.

The semiconductor relay 23 may be responsive to the position or state of the switch 6 via a sensor 31 of the switch 6 and the controller 15. The sensor 31 may, for example, indicate the position or state of the switch 6.

The insulation monitoring devices 17, 18 monitor the insulation resistance between ground and the line section between the fuel cell 2 and the switch 6 or the insulation resistance between the line section between the switch 6 and the rest of the high-voltage network that is at a potential of, for example, approximately 400V. Additional insulation monitoring devices can be connected to the three-phase AC network and the low voltage network 13, if the network sections on the two sides of the DC/AC converter 10 and the DC/DC converter 12 are electrically isolated.

In that case,—in the same manner as was explained with regard to the insulation monitoring devices 17, 18—these insulation monitoring devices will be connected by the non-contacting switching devices of a semiconductor relay that in this case will be tuned to the number of insulation monitoring devices and the number of non-contacting switching devices. One example of a suitable relay is the semiconductor relay commercially available under the product designation NAIS V216 from Matsushita Works Deutschland GmbH. The semiconductor relay is able to execute the switching cycles and only has minimal space requirements. In general, one terminal of the network is connected to ground (FIG. 1).

The semiconductor relay 23 and the insulation monitoring devices 17, 18 may be connected to a master control unit, i.e., controller 15, that evaluates the measured values of the insulation resistances and performs a plausibility check. The plausibility check makes it possible to detect and indicate malfunctions of the insulation monitoring device and the semiconductor relay, for example via a watchdog function.

Each of the insulation monitoring devices 17, 18 may include a change-over switch, which is not shown, the output of which is electrically coupled to the line 22, which possesses two inputs, one of which is electrically coupled to an output of a voltage source while the other is electrically coupled to a second output of the voltage source. This voltage source generates a positive potential at one of its outputs and a negative potential at the other one of its outputs. The reference potential for these potentials is the potential of the output 2 or the line 7, to which one input of the voltage source is connected.

In each monitoring device 17, 18, the change-over switch is periodically actuated by a controller (e.g., the controller 15 or some additional controller such as a microprocessor or microcontroller), so that positive and negative pulses alternate at the output of the change-over switch. In this manner, the controller-controlled change-over switch and the voltage source form an AC pulse voltage source. In the insulation monitoring devices 17, 18, the lines 20, 21 and 26, 27 are connected via high pass filters to analog-digital converters, which are controlled by controller. The network 13 supplies a working voltage to the analog-digital converters and controllers in the insulation monitoring devices 17, 18. A defined duration after each of the measuring pulses has been applied to the resistors 19, 25, the voltages in the lines 20, 21 and 26, 27 are measured at periodic time intervals. Any two consecutive measurement values are used to calculated differential values, whereupon the insulation resistance is calculated using the equation:

$$R_{ins} = \frac{R_M}{\frac{\Delta V_O}{\Delta V_M} - 1},$$

whereby $V_O$ are the voltages in the lines 21 and 26, while $V_M$ are the voltages of the lines 20, 27.

The insulation resistance determined by the insulation monitoring devices 17, 18 can then, for example, be transmitted via a bus (not shown) to the controller 15, which performs a plausibility check. This check is also able to detect malfunctions in the respective insulation monitoring devices, which also are equipped with watchdog arrangements.

Thus, each portion of the network is equipped with its own insulation monitoring device to measure the insulation resistance with respect to ground, and alternatingly one of the insulation monitoring device with a measuring resistor is connected via a conducting non-contacting switching element to the parts at ground potential while the other insulation monitoring device with the measuring resistor is isolated by a non-conducting non-contacting switching element from the parts at ground potential, and vice versa. Thus one advantage of the disclosed embodiments is that the insulation resistance can be measured by the respective insulation monitoring device without the other insulation monitoring device being able to affect or falsify the measurement. The non-contacting interconnection makes it possible to achieve shorter time intervals between measuring cycles, so that one obtains continuous information on the current insulation state. The insulation measurement can be carried out with a practically unlimited number of switching cycles and is unaffected by mechanical effects such as accelerations or deceleration that the device might be subject to.

All of the above U.S. patents, U.S. patent application publications, U.S. patent applications, foreign patents, foreign patent applications and non-patent publications referred to in this specification and/or listed in the Application Data Sheet, including but not limited to German Patent Application No. 10212493.0, filed Mar. 21, 2002, which corresponds to the present application; U.S. patent application Ser. No. 10/316,151, filed Feb. 6, 2003, and entitled "METHOD AND DEVICE FOR INSULATION MONITORING OF A DC NETWORK;" and the corresponding German Patent Application No. 10205381.2, filed Feb. 6, 2002, are incorporated herein by reference, in their entirety.

From the foregoing it will be appreciated that, although specific embodiments of the invention have been described herein for purposes of illustration, various modifications may be made without deviating from the spirit and scope of the invention. Accordingly, the invention is not limited except as by the appended claims.

What is claimed is:

1. An apparatus for insulation monitoring of a DC network, the network being electrically insulated with respect to a frame potential of a device that contains the DC network; the apparatus comprising:
a switch coupled in the network and selectively operable to electrically isolate a first portion of the network from a second portion of the network;
a first insulation monitoring device electrically coupled to the first portion of the network on a first side of the switch to monitor an insulation resistance of the first portion of the network with respect to the frame potential;
a second insulation monitoring device electrically coupled to the second portion of the network on a second side of the switch to monitor the second portion of the network with respect to the frame potential; and
a non-contacting switch selectively operable in a first state to electrically couple the first insulation monitoring device to the frame potential and to electrically decouple the second insulation monitoring device from the frame potential, and selectively operable in a second state to electrically decoupled the first insulation monitoring device from the frame potential and to electrically couple the second insulation monitoring device to the frame potential.

2. The apparatus of claim 1 wherein the first monitoring device comprises a first measuring resistor and the second monitoring device comprises a second measuring resistor.

3. The apparatus of claim 1 wherein the non-contacting switch is a semiconductor relay.

4. The apparatus of claim 1 wherein the network further comprises a power source electrically coupled to the first portion of the network on the first side of the switch; and a load electrically coupled to the second portion of the network on the second side of the switch.

5. The apparatus of claim 1 wherein the network further comprises a power source with a nominal voltage in the range of approximately 200V to approximately 400 V, a DC/DC converter electrically coupled to step the voltage from the power source down to an operating voltage of less than approximately 50 V, and a storage battery electrically coupled to a low voltage side of the DC/DC converter.

6. The apparatus of claim 1 wherein the network further comprises a fuel cell stack power source with a nominal voltage in the range of approximately 200V and approximately 400 V.

7. The apparatus of claim 1, further comprising:
a controller coupled to control the non-contacting switch and to control the first and the second insulation monitoring devices, the controller configured to evaluate measured values of the insulation resistances.

8. The apparatus of claim 1, further comprising:
a controller configured to open the switch to uncoupled a load from a power source upon detecting a low insulation voltage condition.

9. The apparatus of claim 1 wherein the device containing the DC network is a vehicle.

10. The apparatus of claim 1 wherein the device containing the DC network is an electric vehicle comprising a fuel cell stack and an electric traction motor.

11. An electrical network for an electric vehicle, the network being electrically insulated with respect to a frame potential of the electric vehicle; the network comprising:
at least one power source;
at least one load;
a first switch coupled between the power source and the load, and selectively operable to electrically isolate a first portion of the network from a second portion of the network;
a first insulation monitoring device electrically coupled to the first portion of the network on a first side of the switch to monitor an insulation resistance of the first portion of the network with respect to the frame potential;
a second insulation monitoring device electrically coupled to the second portion of the network on a second side of the switch to monitor the second portion of the network with respect to the frame potential;
a second switch selectively operable in a first state to electrically couple the first insulation monitoring device to the frame potential and to electrically decouple the second insulation monitoring device from the frame potential, and selectively operable in a second state to electrically decoupled the first insulation monitoring device from the frame potential and to electrically couple the second insulation monitoring device to the frame potential; and
at least one controller coupled to control the second switch and to control the first and the second insulation monitoring devices, and the controller configured to evaluate measured values of the insulation resistances.

12. The apparatus of claim 11 wherein the second switch is a semiconductor relay comprising a pair of optocouplers to receive control signals from the controller and a pair of semiconductor switches to alternatingly electrically couple a respective measuring resistor of the first and the second monitoring devices to a chassis of the electric vehicle.

13. The apparatus of claim 11 wherein the power source comprises a fuel cell stack and the load comprises an electric traction motor.

14. The apparatus of claim 11 wherein the controller is further configured to open the first switch to uncoupled the load from the power source upon detecting a low insulation voltage condition.

15. The apparatus of claim 11 wherein the controller is further configured to perform a plausibility check.

16. The apparatus of claim 11 wherein the first switch is a contactor switch and the second switch is a non-contacting switch.

17. A method of insulation monitoring of an electrical network, the network being electrically insulated with respect to a frame potential of a device that contains the network, at least one power source and at least one load; the method comprising:

during a first period,
electrically coupling only a first one of a pair of measuring resistors to the frame potential, each of the pair of measuring resistors associated with a respective one of a first and a second measuring device; and
determining an insulation resistance of the network; and during a second period,
electrically coupling only a second one of the pair of measuring resistors to the frame potential; and
determining an insulation resistance of the network.

18. The method of claim 17 wherein determining an insulation resistance of the network comprises:

applying at least one voltage pulse across a respective one of the measuring resistors that is currently coupled to the frame potential;
measuring at least one voltage a defined time after applying the voltage pulse;
determining a difference between consecutive ones of the measured voltages; and
calculating the insulation resistance based on the determined differences.

19. The method of claim 17, further comprising:

comparing the determined insulation resistance of the network to a minimum insulation resistance threshold; and
selectively operating a switch to electrically isolate a first portion of the network comprising a power source from a second portion of the network comprising a load based on an outcome of the determination.

20. The method of claim 17 wherein electrically coupling the measuring resistors to the frame potential comprises activating a semiconductor relay to electrically couple only one of the measuring resistors to a chassis of an electric vehicle while electrically decoupling the other of the measuring resistors from the chassis.

21. The method of claim 17, further comprising:
checking plausibility.

22. An apparatus for insulation monitoring of an electrical network, the network being electrically insulated with respect to a frame potential of a device that contains the network, the apparatus comprising:

means for electrically coupling a first and a second measuring resistor to the frame potential, alternatingly;

means for determining an insulation resistance of the network when only the first one of the measuring resistors is electrically coupled to the frame potential; and means for determining an insulation resistance of the network when only the second one of the measuring resistors is electrically coupled to the frame potential.

23. The apparatus of claim 22, further comprising:

a switch selectively operable to electrically isolate a first portion of the network comprising a power source from a second portion of the network comprising a load.

24. The apparatus of claim 22 wherein the means for electrically coupling a first and a second measuring resistor to the frame potential, alternatingly comprises:

a semiconductor relay having a first semiconductor switch and a second semiconductor switch, the first semiconductor switch coupled between a first measuring resistor and the frame potential and the second semiconductor switch coupled between a second measuring resistor and the frame potential; and control logic to selectively activate the first semiconductor switch while deactivating the second semiconductor switch, and to selectively activate the second semiconductor switch while deactivating the first semiconductor switch.

25. The apparatus of claim 22 wherein the means for electrically coupling a first and a second measuring resistor to the frame potential, alternatingly comprises:

a semiconductor relay having a first semiconductor switch and a second semiconductor switch, the first semiconductor switch coupled between a first measuring resistor and the frame potential and the second semiconductor switch coupled between a second measuring resistor and the frame potential; and control logic to selectively activate the first semiconductor switch while deactivating the second semiconductor switch when activating a first insulation monitoring device, and to selectively activate the second semiconductor switch while deactivating the first semiconductor switch when activating a second insulation monitoring device.

26. The apparatus of claim 22, further comprising:

means for determining whether the insulation resistance is below a threshold value; and a switch selectively operable to electrically isolate a first portion of the network comprising a power source from a second portion of the network comprising a load based on the determination of whether the insulation resistance is below the threshold insulation resistance value.

* * * * *